(12) United States Patent
Dao et al.

(10) Patent No.: US 7,964,502 B2
(45) Date of Patent: Jun. 21, 2011

(54) MULTILAYERED THROUGH VIA

(75) Inventors: Thuy B. Dao, Austin, TX (US); Chanh M. Vuong, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 245 days.

(21) Appl. No.: 12/277,408

(22) Filed: Nov. 25, 2008

(65) Prior Publication Data

US 2010/0130002 A1     May 27, 2010

(51) Int. Cl.
*H01L 21/44* (2006.01)
*H01L 21/60* (2006.01)

(52) U.S. Cl. ......... 438/667; 257/E21.597; 257/E23.011; 257/E23.067; 257/E23.174; 257/698; 257/621; 257/763

(58) Field of Classification Search ............ 438/627, 438/628, 629, 631, 639, 644, 654, 667, 648; 257/698, 752, 753, E21.577, E21.584, E21.585, 257/E21.597, E23.011, E23.067, E23.145, 257/E23.174, 621, 763
See application file for complete search history.

(56) References Cited

U.S. PATENT DOCUMENTS

| | | | |
|---|---|---|---|
| 5,407,698 A | 4/1995 | Emesh | |
| 6,255,204 B1 | 7/2001 | Tobin et al. | |
| 6,271,129 B1 | 8/2001 | Ghanayem et al. | |
| 6,271,592 B1 * | 8/2001 | Kim et al. | 257/751 |
| 6,475,907 B1 * | 11/2002 | Taguwa | 438/648 |
| 6,503,840 B2 * | 1/2003 | Catabay et al. | 438/694 |
| 6,569,759 B2 * | 5/2003 | Taguwa | 438/629 |
| 6,593,233 B1 | 7/2003 | Miyazaki et al. | |
| 6,670,267 B2 * | 12/2003 | Fortin | 438/629 |
| 6,674,171 B2 * | 1/2004 | Yamaguchi | 257/774 |
| 6,787,913 B2 * | 9/2004 | Yamada et al. | 257/763 |
| 7,399,706 B2 * | 7/2008 | Omoto et al. | 438/687 |
| 7,517,798 B2 * | 4/2009 | Tuttle | 438/667 |
| 7,633,165 B2 * | 12/2009 | Hsu et al. | 257/763 |
| 7,683,458 B2 * | 3/2010 | Akram et al. | 257/621 |

(Continued)

FOREIGN PATENT DOCUMENTS

| | | |
|---|---|---|
| GB | 2337151 A | 11/1999 |
| JP | 06-151815 | * 5/1994 |

OTHER PUBLICATIONS

Clark et al; "Integrated Deposition and Etchback of Tungsten in a Multi-Chamber, Single-Wafer System"; June 1990 VMIC Conference, IEEE, pp. 478-485.

(Continued)

*Primary Examiner* — Mary Wilczewski
(74) *Attorney, Agent, or Firm* — James L. Clingan, Jr.

(57) ABSTRACT

A method for forming a through substrate via (TSV) comprises forming an opening within a substrate. An adhesion layer of titanium is formed within the via opening, a nucleation layer of titanium nitride is formed over the adhesion layer, and a tungsten layer is deposited over the nucleation layer, the tungsten layer having a thickness less than or equal to a critical film thickness sufficient to provide for film integrity and adhesion stability. A stress relief layer of titanium nitride is formed over the tungsten layer and a subsequent tungsten layer is deposited over the stress relief layer. The subsequent tungsten layer has a thickness less than or equal to the critical film thickness. The method further includes planarizing to expose the interlevel dielectric layer and a top of the TSV and backgrinding a bottom surface of the substrate sufficient to expose a bottom portion of the TSV.

19 Claims, 18 Drawing Sheets

U.S. PATENT DOCUMENTS

| | | | |
|---|---|---|---|
| 7,777,323 B2 * | 8/2010 | Kwon et al. | 257/686 |
| 2009/0160061 A1 * | 6/2009 | Hsu et al. | 257/763 |
| 2009/0176362 A1 * | 7/2009 | Akram et al. | 438/612 |
| 2009/0243046 A1 * | 10/2009 | Shi et al. | 257/621 |
| 2010/0035430 A1 * | 2/2010 | Andry et al. | 438/667 |
| 2010/0237502 A1 * | 9/2010 | Yu et al. | 257/751 |

OTHER PUBLICATIONS

Kikuchi et al; "Tungsten Through-Silicon Via Technology for Three-Dimensional LSIs"; Japanese Journal of Applied Physics, vol. 47, No. 4, 2008, pp. 2801-2806.

* cited by examiner

MULTILAYERED THROUGH VIA

BACKGROUND

1. Field

This disclosure relates generally to semiconductors, and more specifically, to through vias used in semiconductors.

2. Related Art

The use of through vias, which are vias that pass through a substrate and are also known as through substrate vias (TSVs), have come into more common usage. Many difficulties, however, remain. One continuing problem is sufficiently filling the through via without forming voids. This is a difficult issue due to the relatively long distance the through via must traverse in going from one side of a substrate to the other side. Further, there are issues relating to compatibility with preferred materials used for front end processes. Copper is commonly used for interconnect but use for vias, especially in contacting silicides, has provided problems. Even though many deposition problems with plating copper have been overcome, copper has not been found to be effective for through vias due in part with incompatibility with the contact materials used for contacting silicides. Also plating can be difficult in a via that is very small or has a high aspect ratio.

Thus, there is a need for a technique that provides through vias that improve upon one or more of the issues raised above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a through via is made by forming an opening in a substrate to a first depth, a first layer of titanium nitride is deposited to line the opening. A much thicker first layer of tungsten is deposited over the first layer of titanium nitride. After the deposition of the first layer of tungsten, a second layer of titanium nitride is deposited in the opening. After the deposition of the second layer of titanium nitride, a second layer of tungsten is deposited in the opening. As needed, an etch back of the first layer of tungsten may be etched back to remove tungsten at the top portion of the opening. Subsequent processing establishes contact to the tungsten in the opening, and a backgrind of the substrate is performed to expose tungsten at a bottom of the opening. Also it is beneficial to precede the first titanium nitride layer with a titanium layer. This is better understood by reference to the drawings and the following specification.

The semiconductor substrate described herein can be any semiconductor material or combinations of materials, such as gallium arsenide, silicon germanium, silicon-on-insulator (SOI), silicon, monocrystalline silicon, the like, and combinations of the above.

Figure 1:
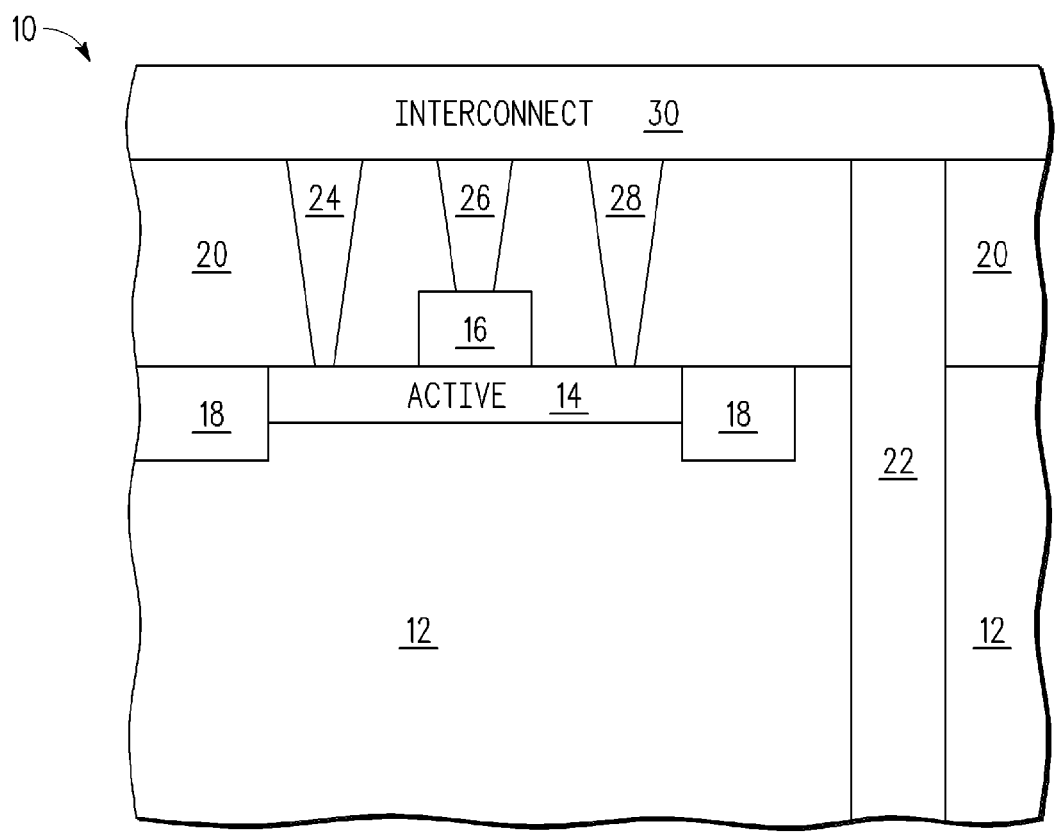
FIG. 1 is a device structure made by embodiments of the invention.

Shown in FIG. 1 is a device structure 10 comprising a substrate 12, an active region 14 in the substrate surrounded by an isolation region 18, a gate 16 substantially centered over active region 14, an interlayer dielectric 20 over substrate 12, a through via 22 from a top surface of interlayer dielectric 20 through substrate 12, an interconnect 30 over interlayer dielectric 20, a contact 24 between interconnect 30 and active region 14, a contact 26 between gate 16 and interconnect 30, and a contact 28 between interconnect 30 and active region 14. Contact 26 may contact gate 16 outside active region 14 rather than over it as shown in FIG. 1. Gate 16 preferably has a gate dielectric between it and active region 14. Active region 14 has the various doped regions useful in making a transistor. These implants may include for example source implants, drain implants, threshold adjust implants, halo implants. The combination of active region 14 and gate 16 and its gate dielectric form a transistor that may be a power transistor. Although potentially useful in a variety of semiconductor applications, through vias are particularly useful in conjunction with power transistors. Interconnect 30, which may include only one metal layer or many more. Interconnect 30 is used for interconnecting transistors and connecting the transistors to power and ground. Through vias such as through via 22 are particularly useful for providing ground. Thus interconnect 30 may connect through via 22 to one of contacts 24, 26, and 28. Through via 22 includes alternating layers of titanium nitride and tungsten with tungsten being by far the largest percentage. A thin layer of titanium provides the interface between substrate 12 and through via 22. Substrate 12 is very high resistance so the voltage level, which is preferably ground potential, of through via 22 will have minimal impact on active region 14. To further improve isolation between through via 22 and active region 14, an oxide layer may be formed along the interface between substrate 12 and through via 22. Interlayer dielectric 20 may be 0.1 microns or more above gate 16. Gate 16 may be 0.3 microns in height. Substrate 12 may be 270 microns thick. A description of two methods of obtaining through via 22 follow. Through via 22 may also be called a through substrate via (TSV).

Figure 2:
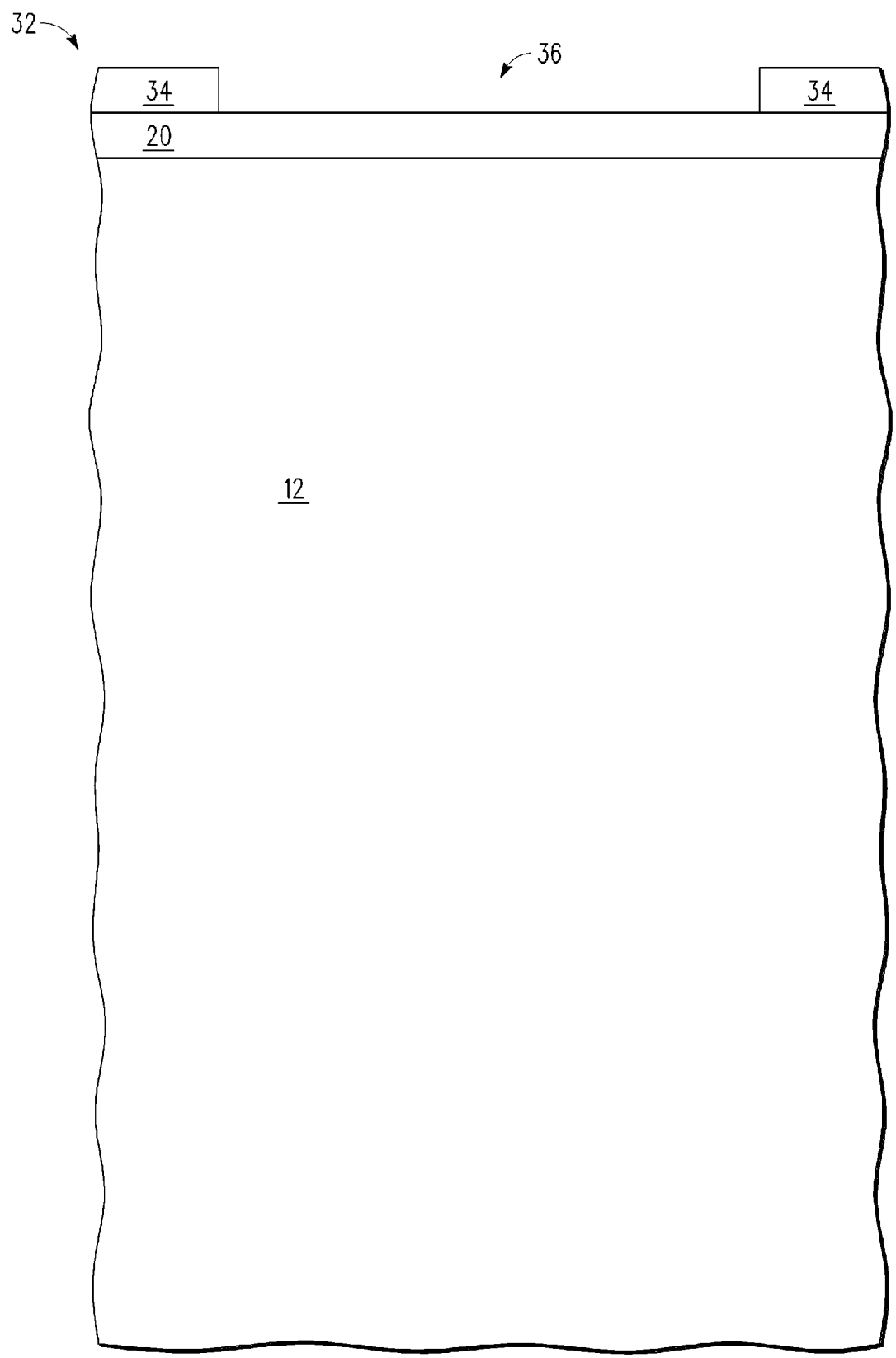
FIG. 2 is a cross section of a device structure useful in forming the through via of FIG. 1 at a stage in processing according to a first embodiment.

Shown in FIG. 2 is a semiconductor device 32 that will be further processed to become a through via useful as through via 22. Semiconductor device 32 in FIG. 2 comprises substrate 12, interlayer dielectric 20 over substrate 12, and a patterned hard mask 34 over interlayer dielectric 20. Patterned hard mask 34 has an opening 36. In this example, opening 36 is considered a relatively large opening and may be 10 microns. An opening of 10 microns and above may be considered a large opening. Interlayer dielectric 20 may comprise oxide and this oxide may be deposited by a number of techniques such as spin-on and chemical vapor deposition. Hard mask 34 may also be oxide and may be tetraethylorthosilicate glass (TEOS).

Figure 3:
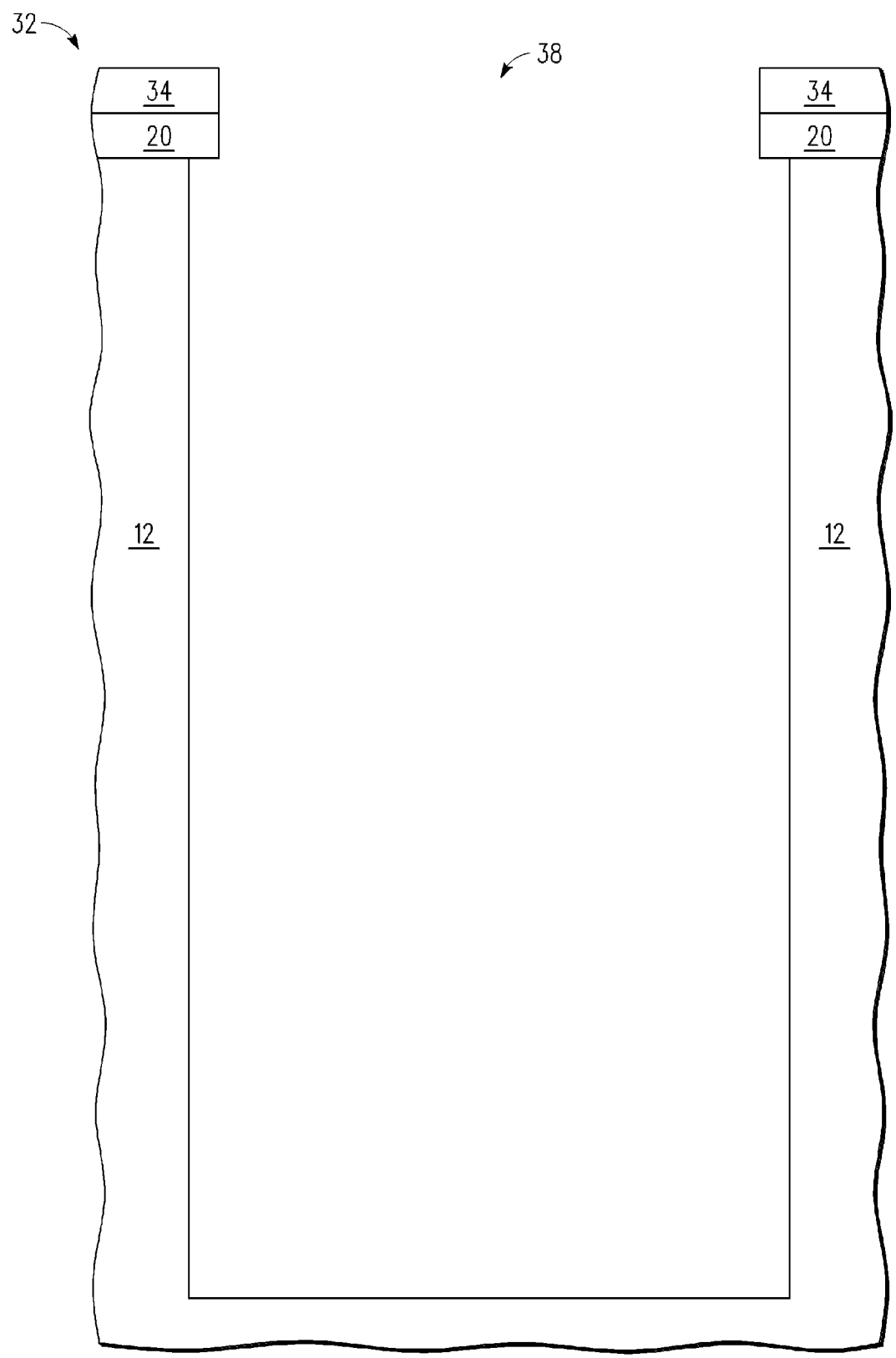
FIG. 3 is a cross section of the device structure of FIG. 2 at a subsequent stage in processing.

Shown in FIG. 3 is semiconductor device 32 after an etch is performed through opening 38 into substrate 12 which results in an opening 38 in substrate 12 that may be 80 microns deep. This etch is an anisotropic etch so that the sides are nearly vertical but due to the relatively long time required for the etch there is some lateral etching. The result is that interlayer dielectric 20 overhangs the opening by, for example, about 0.5 microns. The amount of overhang can vary depending on the etchant and the time the etchant is applied. Although nearly vertical, the bottom of opening 38 in substrate 12 is not as wide as opening 38 at the top. Opening 38 may thus be called tapered.

Figure 4:
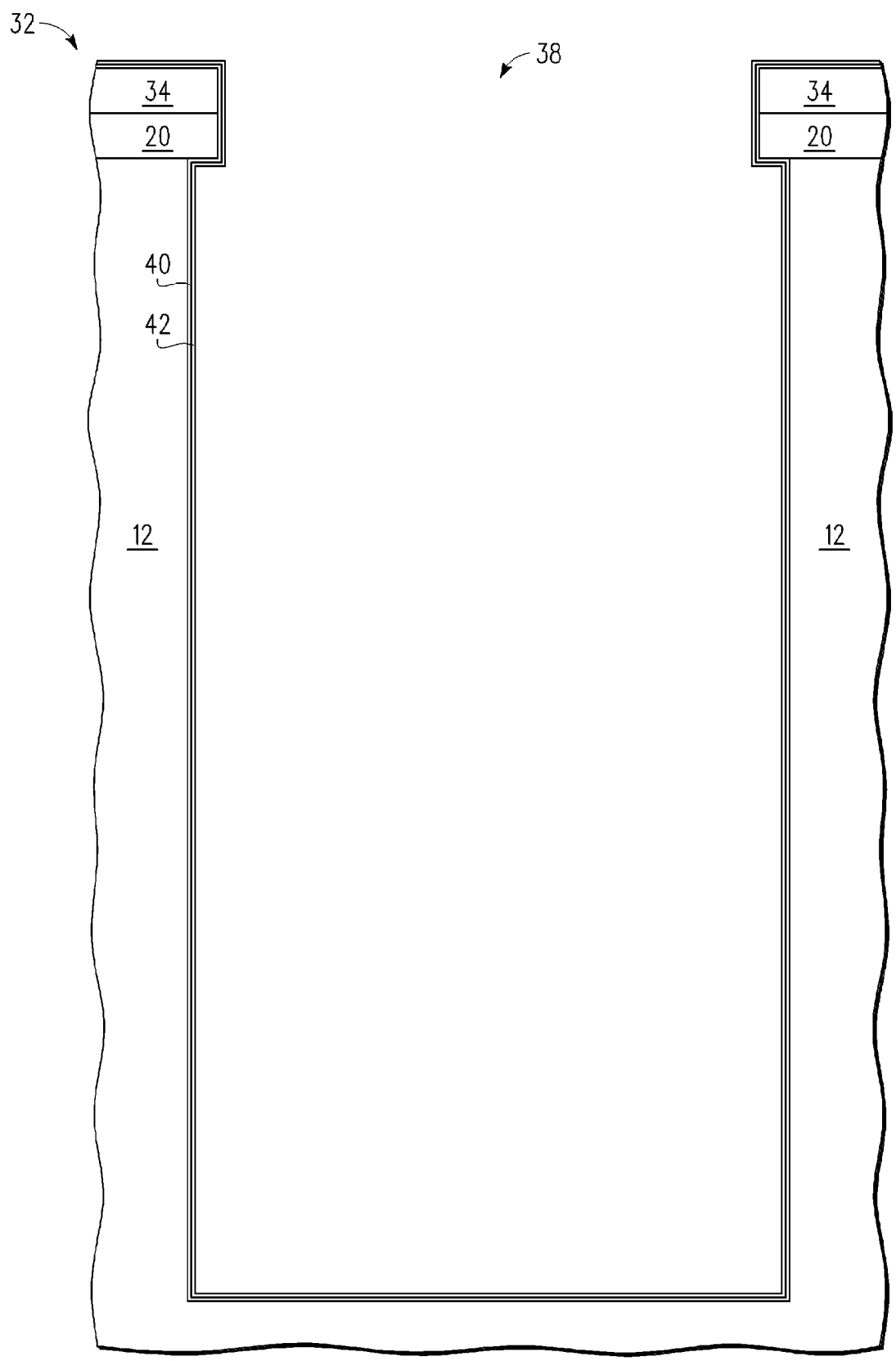
FIG. 4 is a cross section of the device structure of FIG. 3 at a subsequent stage in processing.

Shown in FIG. 4 is semiconductor device 32 after depositing a titanium layer 40 to coat opening 38 followed by a titanium nitride layer 42. Both titanium layer 40 and titanium nitride layer 42 may be 0.015 microns thick and are very conformal and coat the underside of the overhang and the sides of the opening to substantially the same thickness as the bottom of the opening. High level of conformality for titanium may be obtained by a process known as ion metal plasma (IMP). High conformality of titanium nitride can be obtained using chemical vapor deposition (CVD). The thicknesses may vary substantially. An example of a range of thicknesses of titanium layer 40 and titanium nitride layer 42 is 0.01 to 0.04 microns. Also titanium layer 40 and titanium nitride layer 42 need not be the same thickness. Titanium layer 40 functions as an adhesion layer. Titanium adheres well to the silicon of substrate 12 and titanium nitride adheres well to it. Titanium nitride layer 42 functions as a nucleation layer. Tungsten attaches well to titanium nitride.

Figure 5:
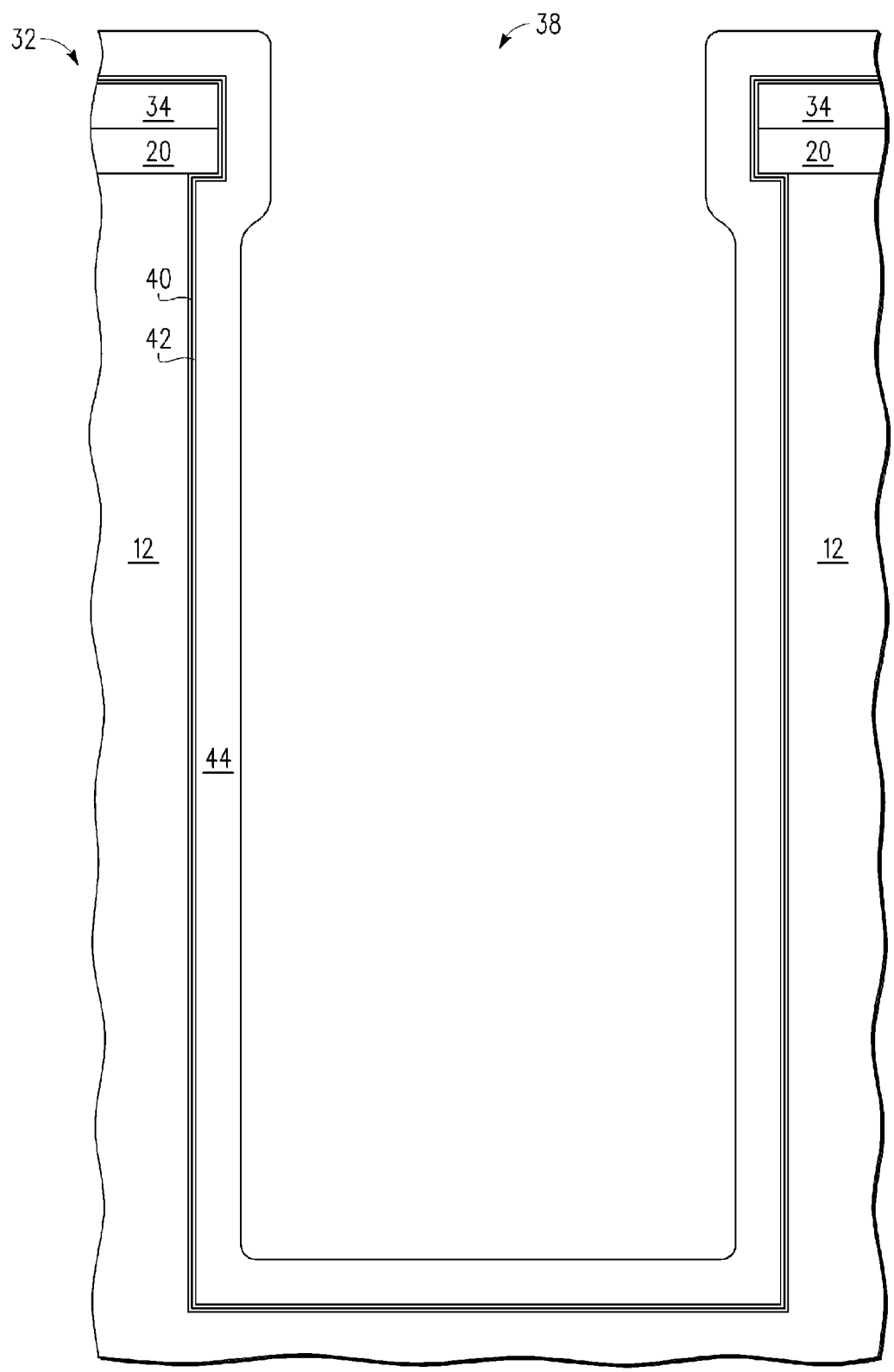
FIG. 5 is a cross section of the device structure of FIG. 4 at a subsequent stage in processing.

Shown in FIG. 5 is semiconductor device 32 after depositing a tungsten layer 44 having a thickness of about 1 micron. It has been found that tungsten has a critical film thickness of about 1 micron. It has been found that tungsten begins flaking off when the deposition exceeds 1 micron in thickness. Such flaking off will cause contamination of the deposition equipment as well as the wafers being processed. This flaking is very detrimental. Tungsten layer 44 is deposited by CVD and is thus very conformal including following the overhang.

Figure 6:
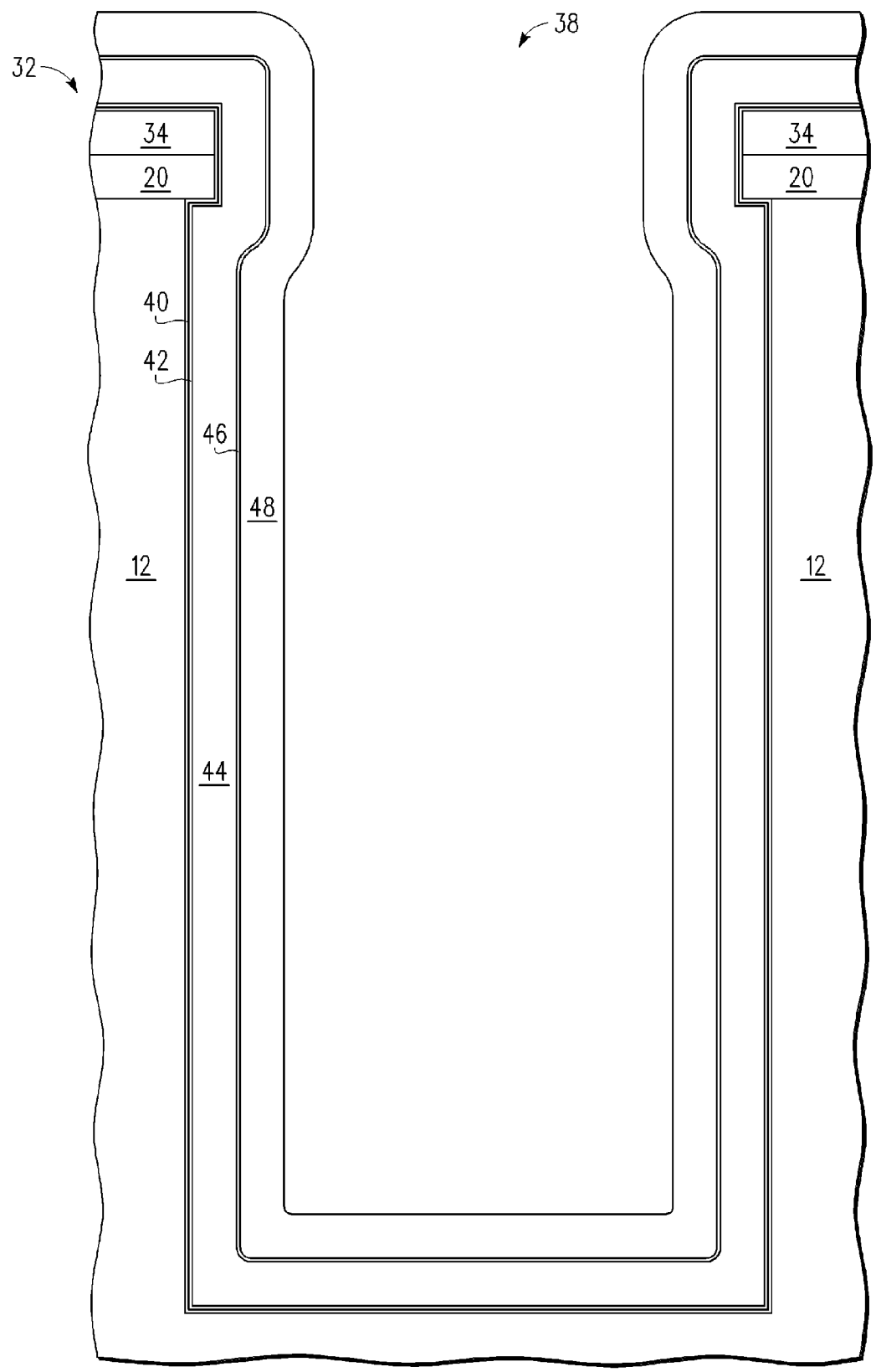
FIG. 6 is a cross section of the device structure of FIG. 5 at a subsequent stage in processing.

Shown in FIG. 6 is semiconductor device 32 after depositing a titanium nitride layer 46 followed by a tungsten layer 48. Titanium nitride layer 46 may be the same thickness as titanium nitride layer 42 and deposited the same way so that is deposited very conformally. Similarly, tungsten layer 48 may be the same thickness as tungsten layer 44 and deposited the same way so that it is also very conformal. Titanium nitride layer 46 is believed to provide a stress buffer between tungsten layers 44 and 48 so that tungsten layer 48 does not flake. Also, titanium nitride layer 46 is also preferably sufficiently thick, such as 0.01 micron, to overcome surface roughness of tungsten layer 44. With titanium nitride layer 46 at 0.01 micron in thickness, tungsten layer 48 has been found to be able to be deposited at 1 micron in thickness without causing a problem with flaking. Thus titanium nitride layer 46 may be considered a stress relief layer. In this example of opening 38 being at 10 microns, 2 sequential tungsten depositions at 1 micron results in narrowing opening 38 to about 6 microns. With the large 10 micron opening, the amount of metal conductive material is large. Opening 38 is not required to be filled in order to achieve a very low resistance contact. Additional metal deposition may or may not be desired. Additional improvement in resistance may not be worth the additional time and cost of further metal depositions. If additional metal deposition is not desired, then the remaining portion of opening 38 may be filled with, for example, a spin-on oxide. If it is desired to have additional metal to further reduce resistivity, additional alternating steps of titanium nitride and tungsten may continue.

Figure 7:
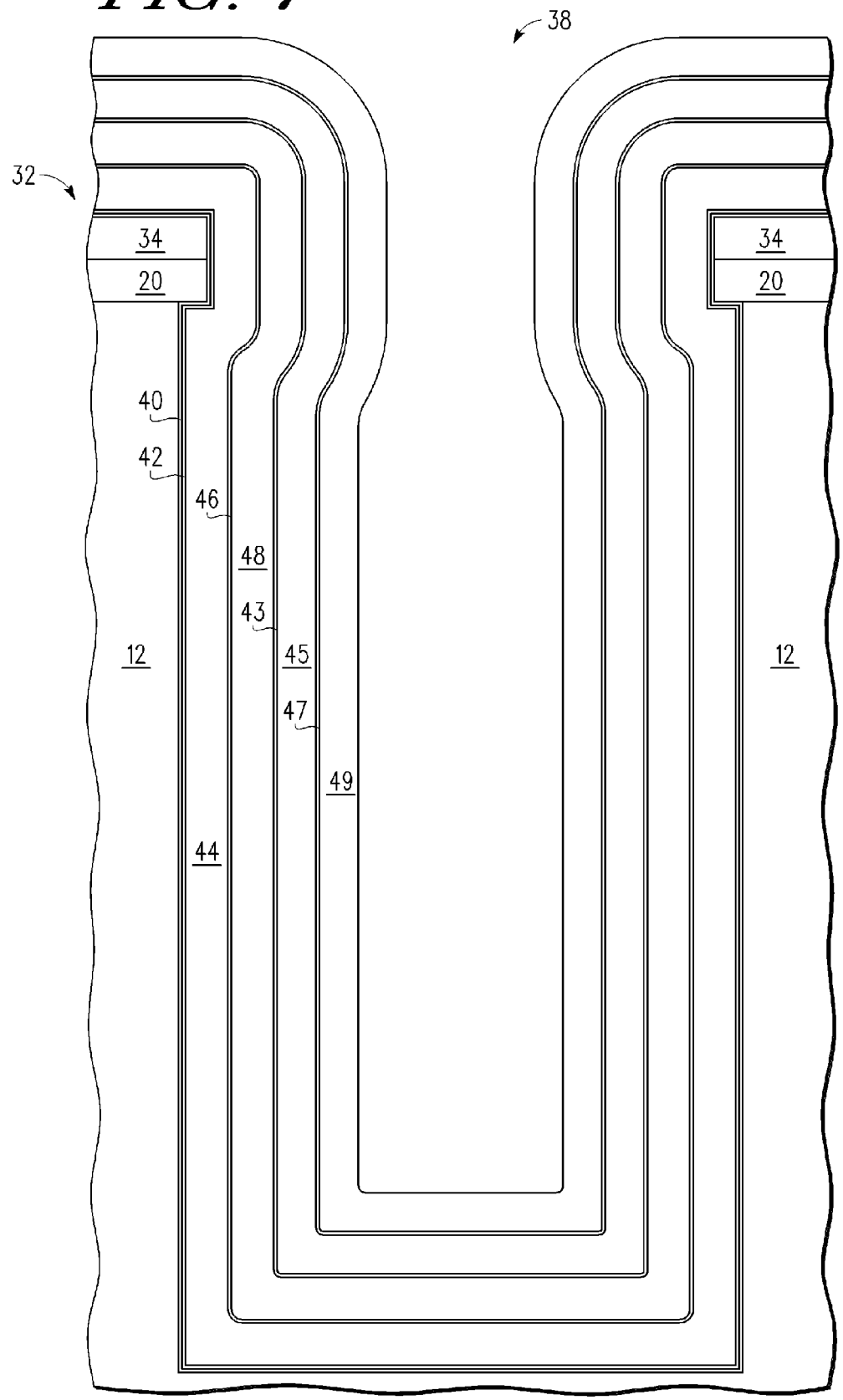
FIG. 7 is a cross section of the device structure of FIG. 6 at a subsequent stage in processing.

Shown in FIG. 7 is semiconductor device after depositing a titanium nitride layer 43 on tungsten layer 48, depositing a tungsten layer 45 on titanium nitride layer 43, depositing a titanium nitride layer 47 on tungsten layer 45, and depositing a tungsten layer 49 on titanium layer 47. Titanium nitride layers 43 and 47 are also have a nominal thickness of 0.01 micron but can be varied. Similarly tungsten layers 45 and 49 have a thickness of preferably 1 micron. Tungsten layers 45 and 49 double the metal to that provided in FIG. 6 for the through via that is being formed. Another layer of tungsten could be added even though it is likely that it would be desirable for it to be less than 1 micron. Another layer of tungsten at 1 micron is likely to close of the top portion of opening 38 before the lower portion of opening 38 is filled resulting in an undesirable void.

Figure 8:
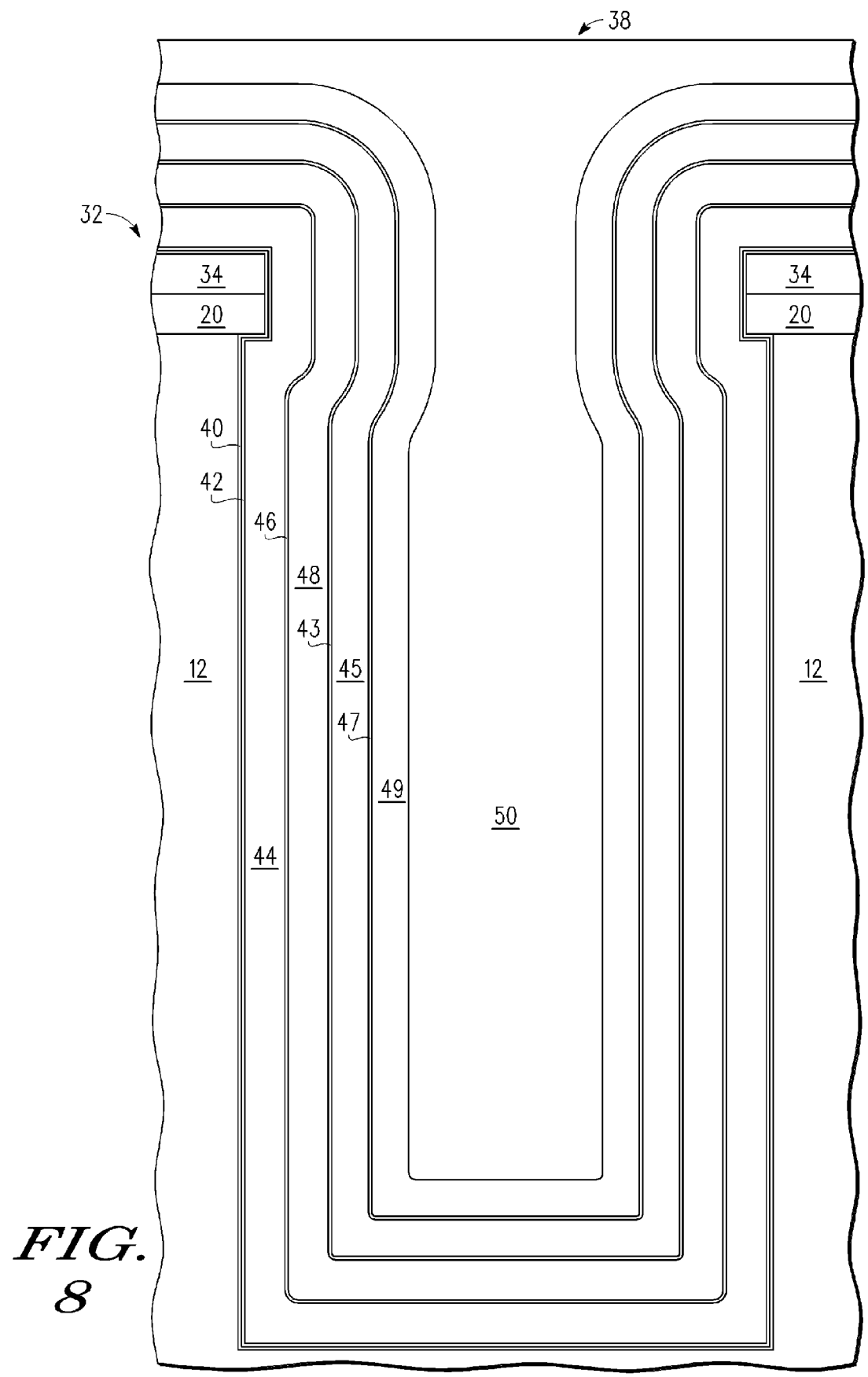
FIG. 8 is a cross section of the device structure of FIG. 7 at a subsequent stage in processing.

Shown in FIG. 8 is semiconductor device 32 after filling opening 38 with a spin-on oxide 50. This results in oxide also being over tungsten layers 44, 48, 45, and 49 outside of opening 38. Oxide 50 prevents a void resulting from the depositions of tungsten being conformal and thus following the overhang.

Figure 9:
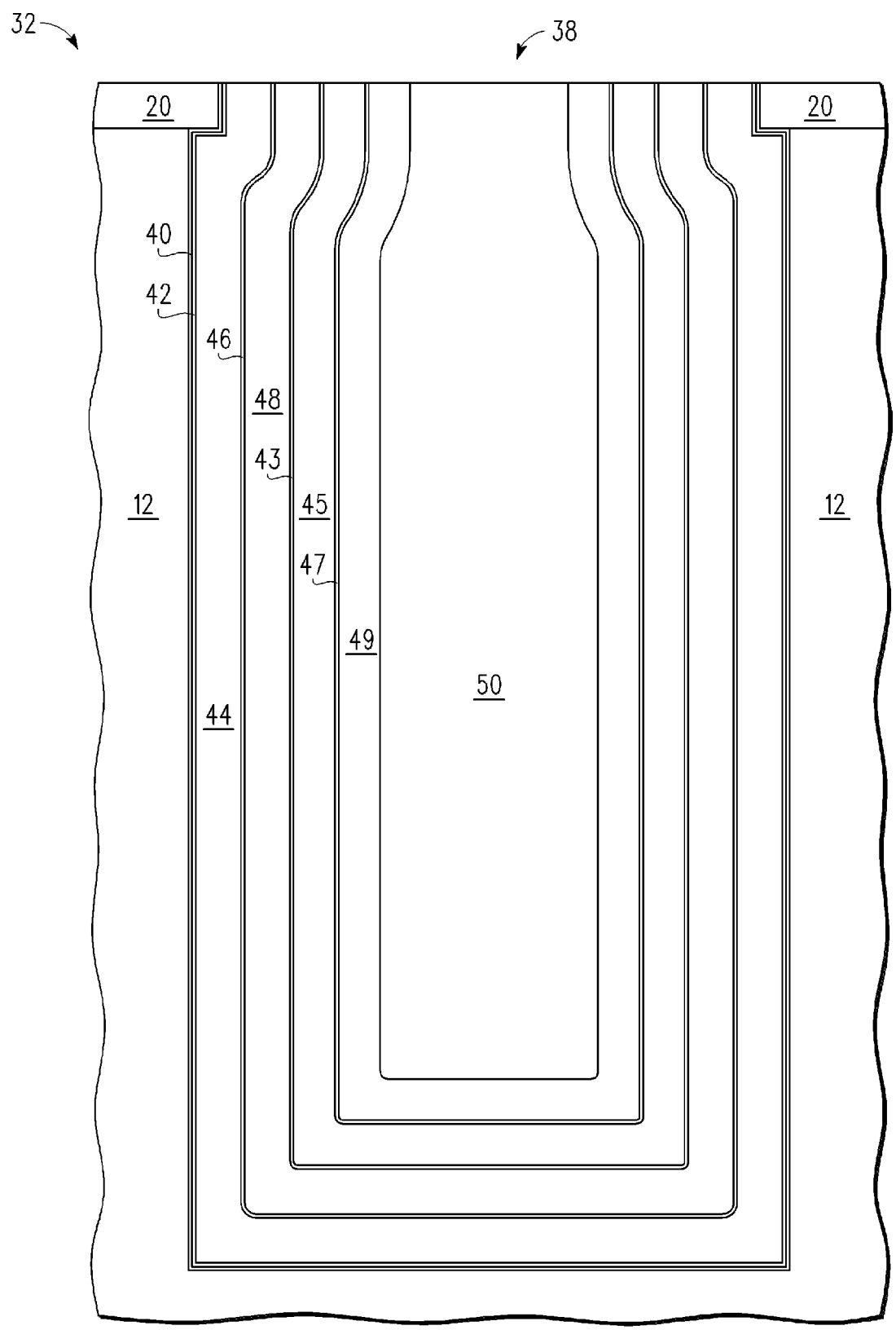
FIG. 9 is a cross section of the device structure of FIG. 8 at a subsequent stage in processing.

Shown in FIG. 9 is semiconductor device 32 after performing chemical mechanical polishing (CMP) on a top surface of semiconductor device 32 down to interlayer dielectric 20. This is preferably two different types of CMP. One is for first removing the top portion of oxide 50 down to tungsten layers 44, 48, 45, and 49. This is followed by CMP step for removing tungsten. The primary difference is in the composition of the slurry. Different slurries used for oxide CMP and tungsten CMP are known in the art. Of course during the tungsten CMP, some of oxide 50 is also removed as part of the CMP step. As an alternative to the oxide CMP step, an etch back may be performed. After the tungsten CMP step, there is left a flat surface having large areas of exposed tungsten in opening 38. After this CMP step, contacts 24, 26, and 28 shown in FIG. 1 are formed. Because the through via does not include copper, copper contamination does not occur during the CMP step and so the step of forming contacts 24, 26, and 28 is not contaminated with copper.

Figure 10:
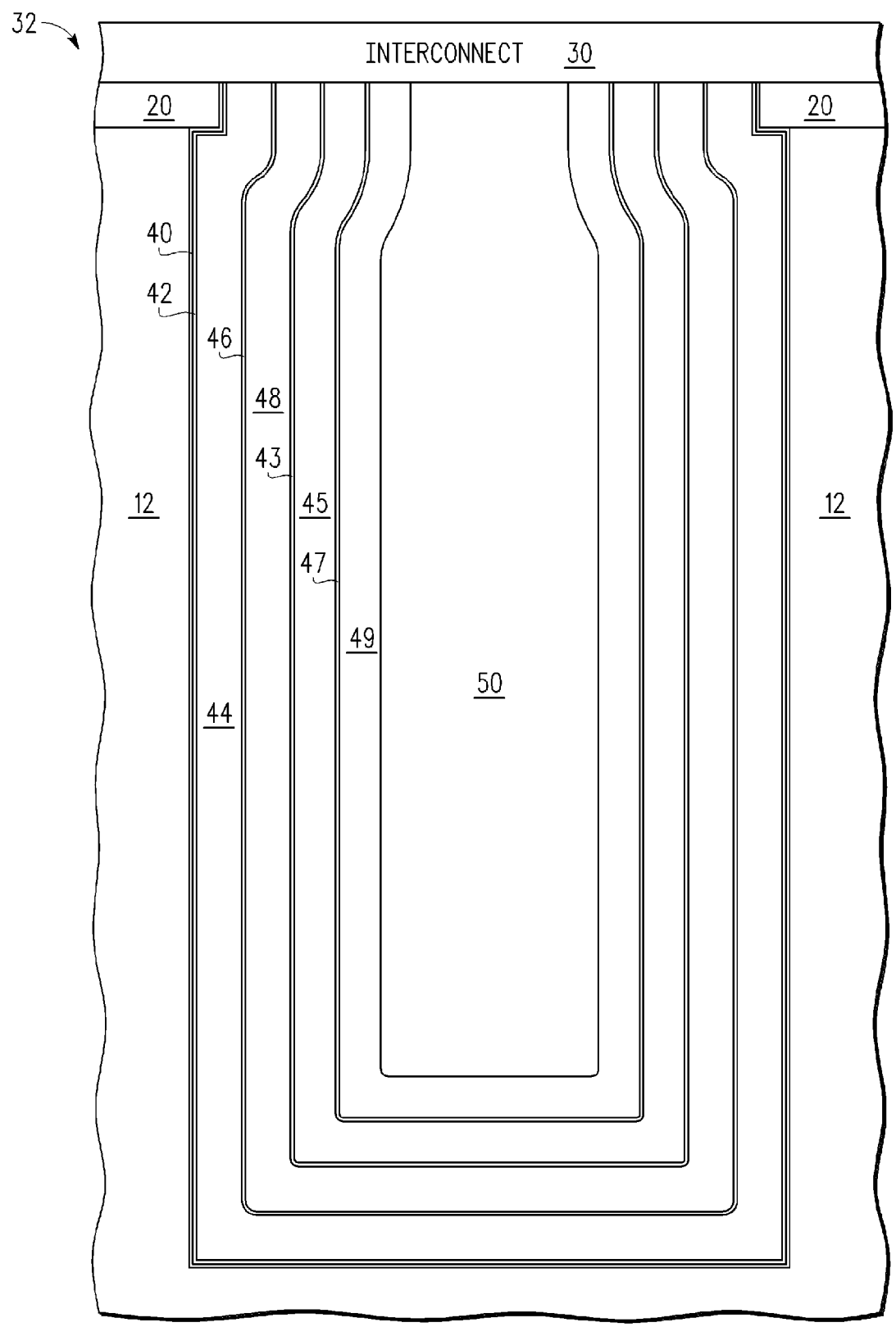
FIG. 10 is a cross section of the device structure of FIG. 9 at a subsequent stage in processing.

Shown in FIG. 10 is semiconductor device 32 after forming interconnect 30 in contact with tungsten layers 44, 48, 45, and 49.

Figure 11:
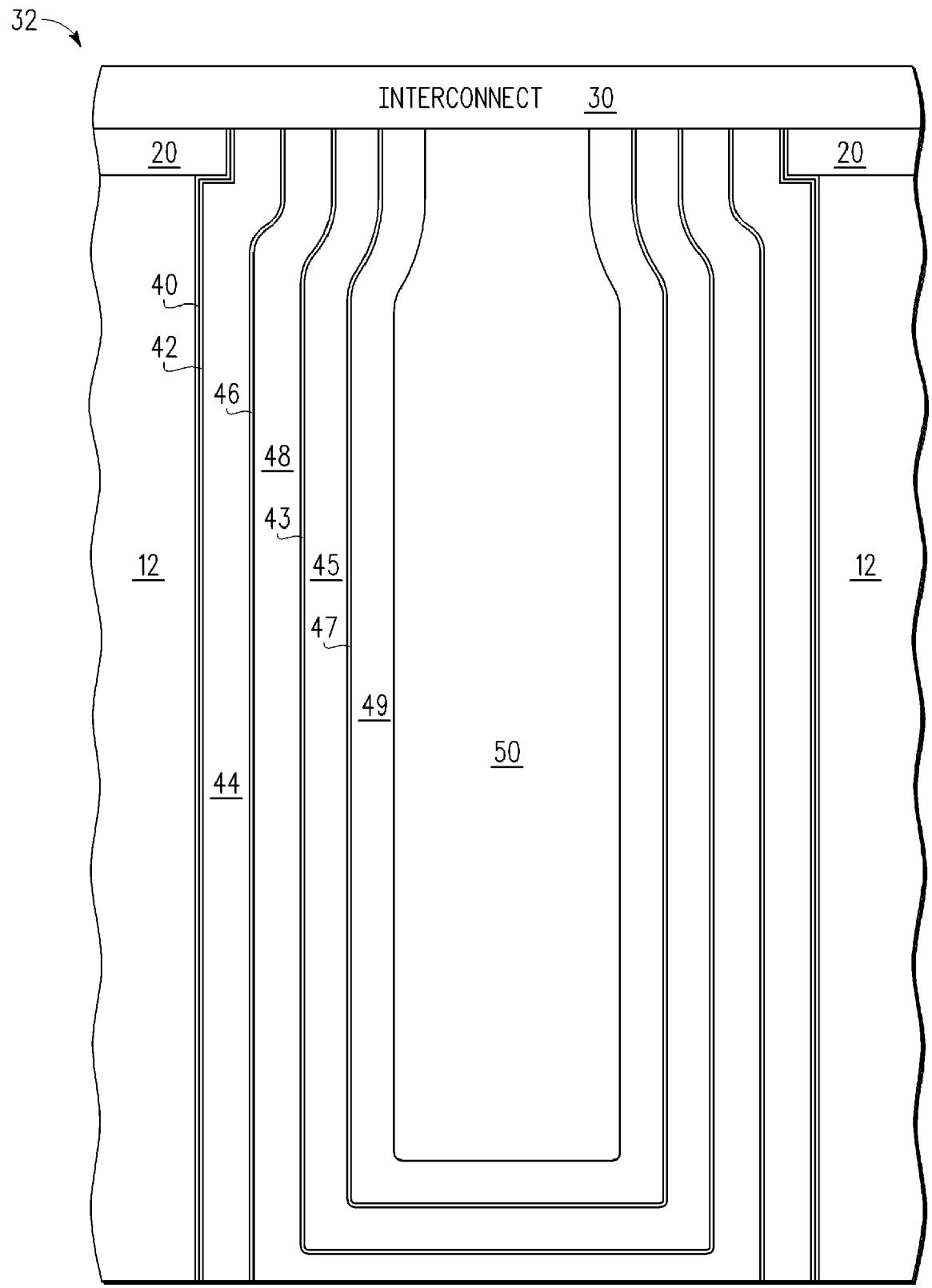
FIG. 11 is a cross section of a device structure useful in forming the through via of FIG. 1 at a stage in processing according to a second embodiment.

Shown in FIG. 11 is semiconductor device 32 after performing a backgrind on substrate 12 to expose tungsten layers 44, 48, 45, and 49 on a bottom side of substrate 12. Thus a through via comprised of tungsten layers 44, 48, 45, and 49, titanium nitride layers 42, 46, 43, and 47, and titanium layer 40 between exposed bottom side of substrate 12 and interconnect 30 is useful as through via 22 of FIG. 1.

The result shown in FIG. 11 is beneficial as showing a through via providing ample tungsten for low resistivity while avoiding problems such as voids and flaking tungsten. Also, since no copper is required, the problem of copper contamination is avoided. The potential of copper contamination arises primarily when a step of CMP is performed. Trace amounts of copper remaining are sufficient to contaminate subsequent processes used in forming tungsten contact to silicided sources, drains, and gates. The problems with flaking tungsten have found to be prevented by using a thin layer of titanium nitride as a buffer between tungsten layers that may be as thick as 1 micron.

Figure 12:
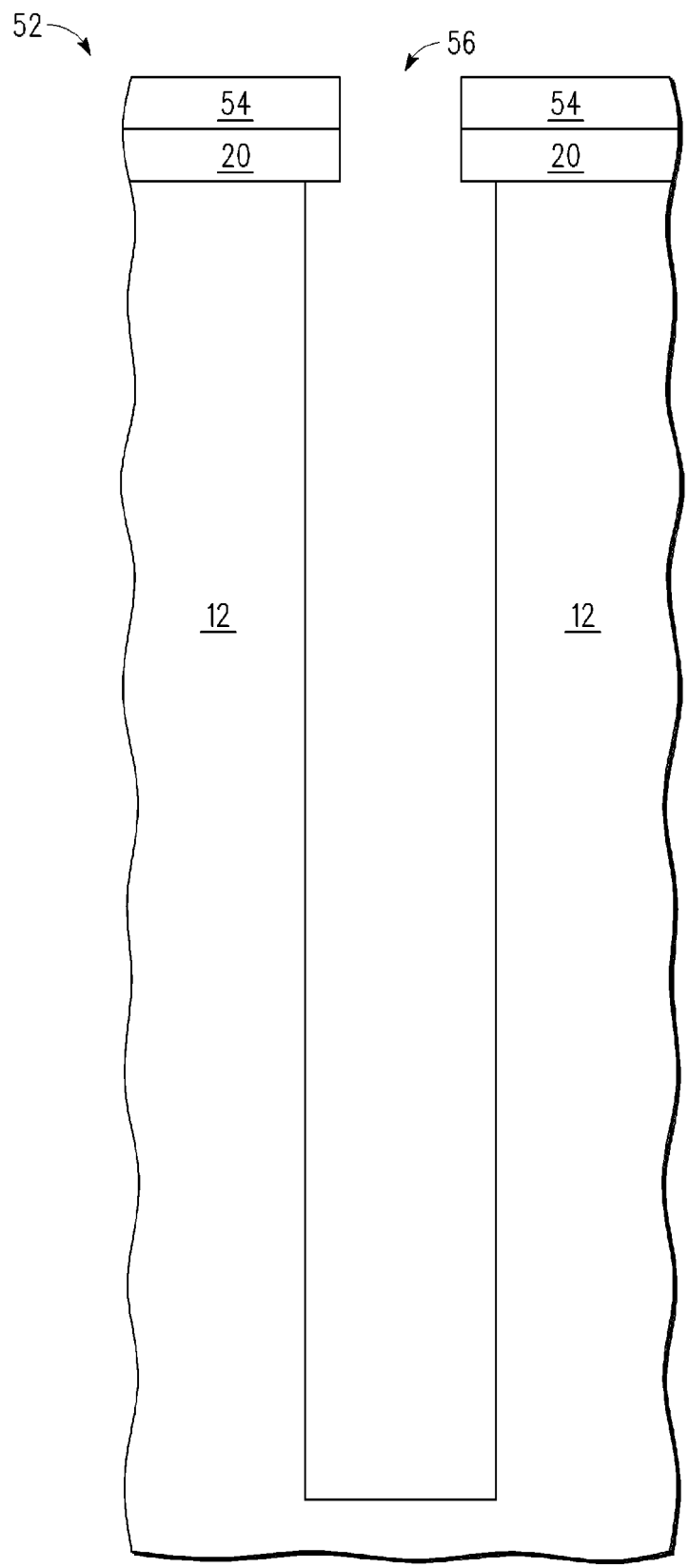
FIG. 12 is a cross section of a device structure useful in forming the through via of FIG. 1 at a stage in processing according to a second embodiment.

Shown in FIG. 12 is a semiconductor device 52 comprising substrate 12, interlayer dielectric 20, and patterned hard mask 54 after an etch that forms an opening 56. Semiconductor device 52 is the same as semiconductor device 32 as shown in FIG. 4 except that opening 56 across hard mask 54 is about 2 microns. The overhang remains at about 0.5 micron.

Figure 13:
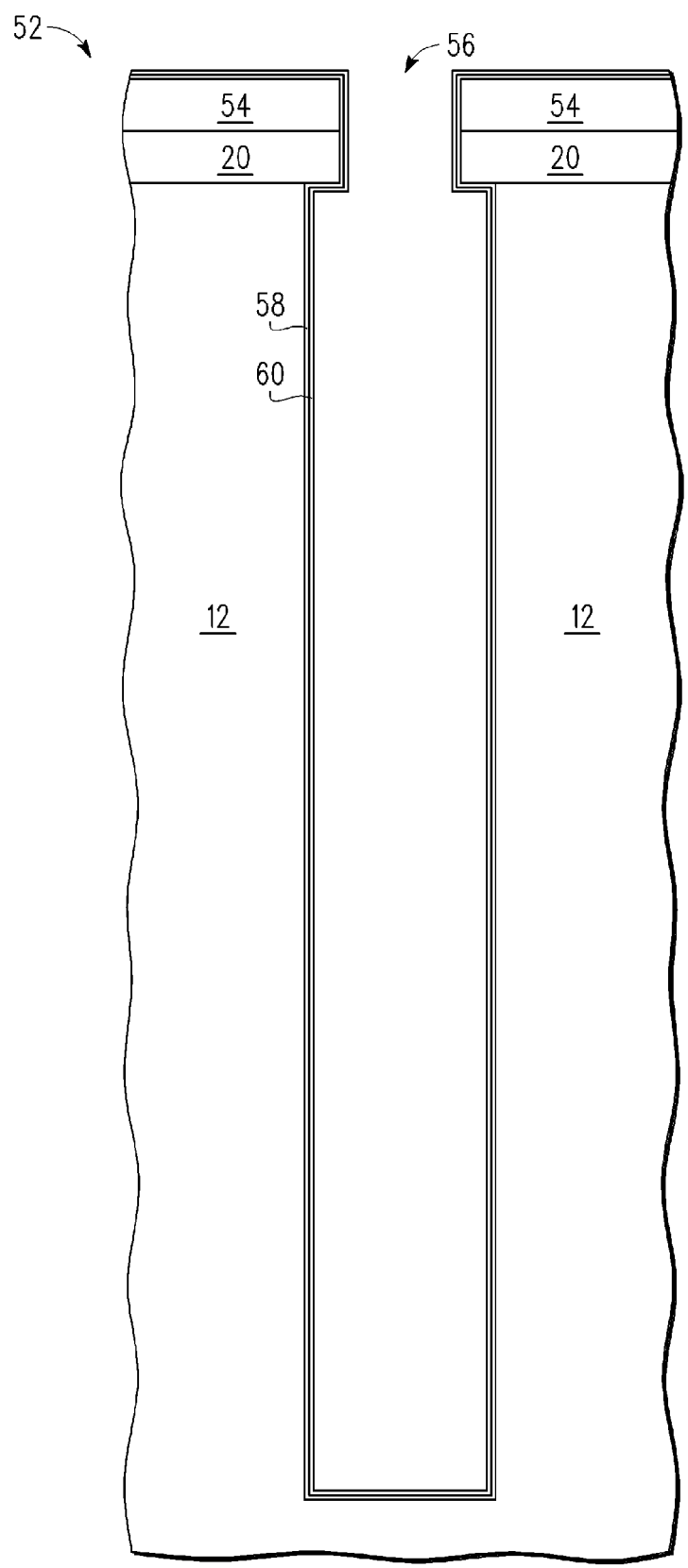
FIG. 13 is a cross section of the device structure of FIG. 12 at a subsequent stage in processing.

Shown in FIG. 13 is semiconductor device 52 after forming titanium layer 58 and titanium layer 60 in the same manner as titanium layer 40 and titanium nitride layer 46 shown in FIG. 4.

Figure 14:
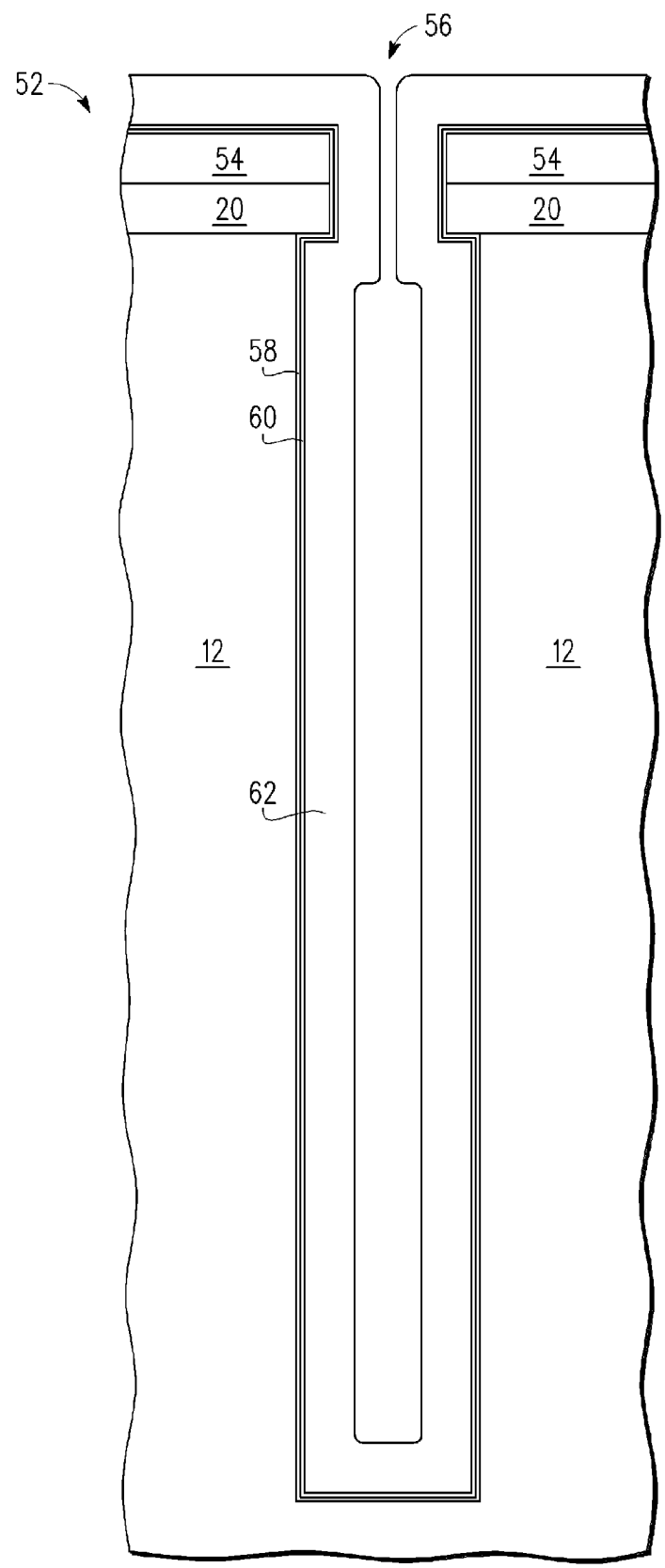
FIG. 14 is a cross section of the device structure of FIG. 13 at a subsequent stage in processing.

Shown in FIG. 14 is semiconductor device 52 after depositing a tungsten layer 62 at a thickness of 0.8 micron. With the overhang, tungsten layer 62 has nearly come together at the top of opening 58 while the lower portion has a significant separation. Tungsten layer 62 is deposited to be 0.8 micron in thickness to ensure that the top portion of opening 58 does not close. In the portion of opening 56 below the overhang, there is still about 1.4 microns separating the two vertical portions of tungsten layer 62 for most of the length of tungsten layer 62. This results in a very significant percentage of the total amount of the volume of opening 56. To continue depositing tungsten would constrict opening 58 at the top and no additional tungsten would be deposited in the lower portion of opening 58.

Figure 15:
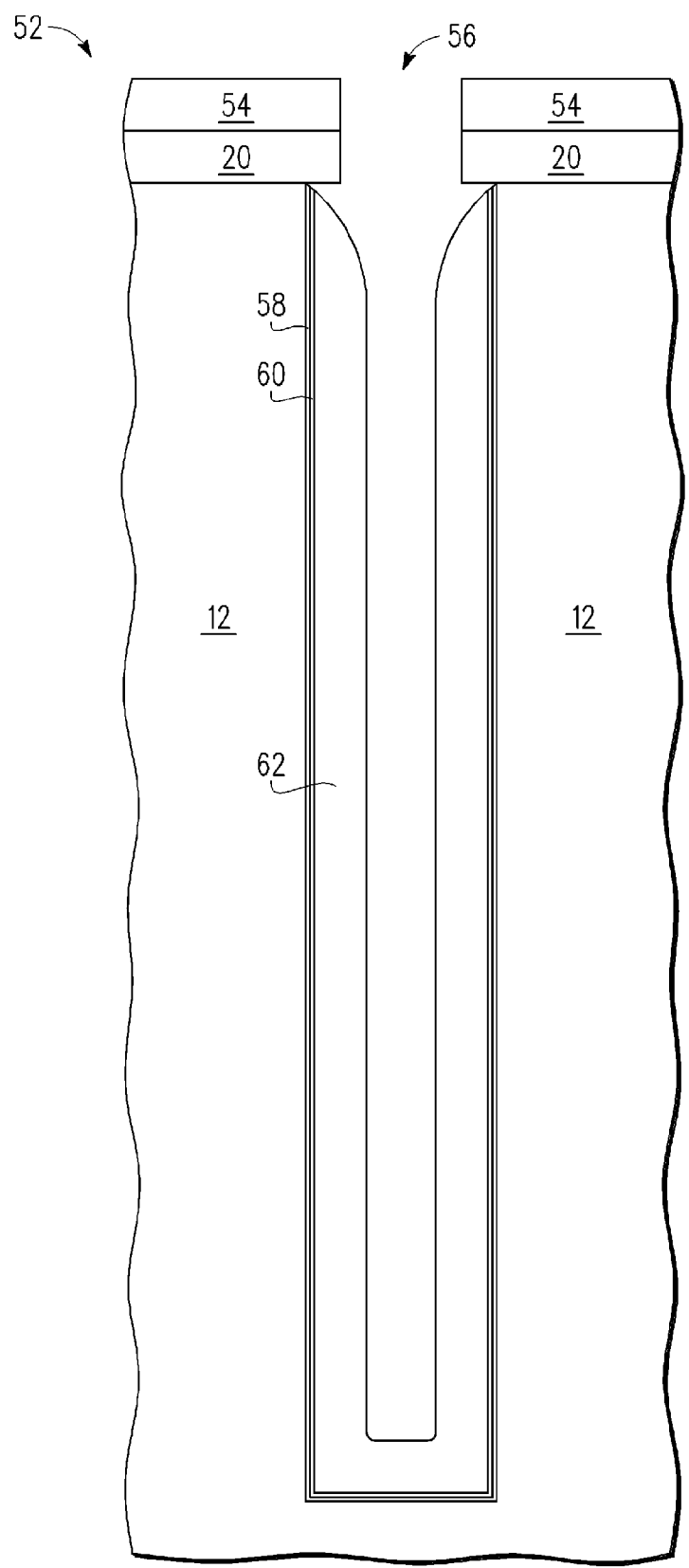
FIG. 15 is a cross section of the device structure of FIG. 14 at a subsequent stage in processing.

Shown in FIG. 15 is semiconductor device 52 after performing an anisotropic etch to remove the tungsten in the top portion of opening 58. This anisotropic etch is followed by an isotropic etch which removes tungsten, titanium, and titanium nitride even under the overhang. This also removes tungsten layer 62, titanium nitride layer 60, and titanium layer 58 in the area over hard mask 54 and interlayer dielectric 20. The result is that the top portion of opening 58 is at least as wide as the lower portion. Thus, there is no longer a constriction to opening 58 that risks cutting off subsequent depositions from reaching the lower portions of opening 58.

Figure 16:
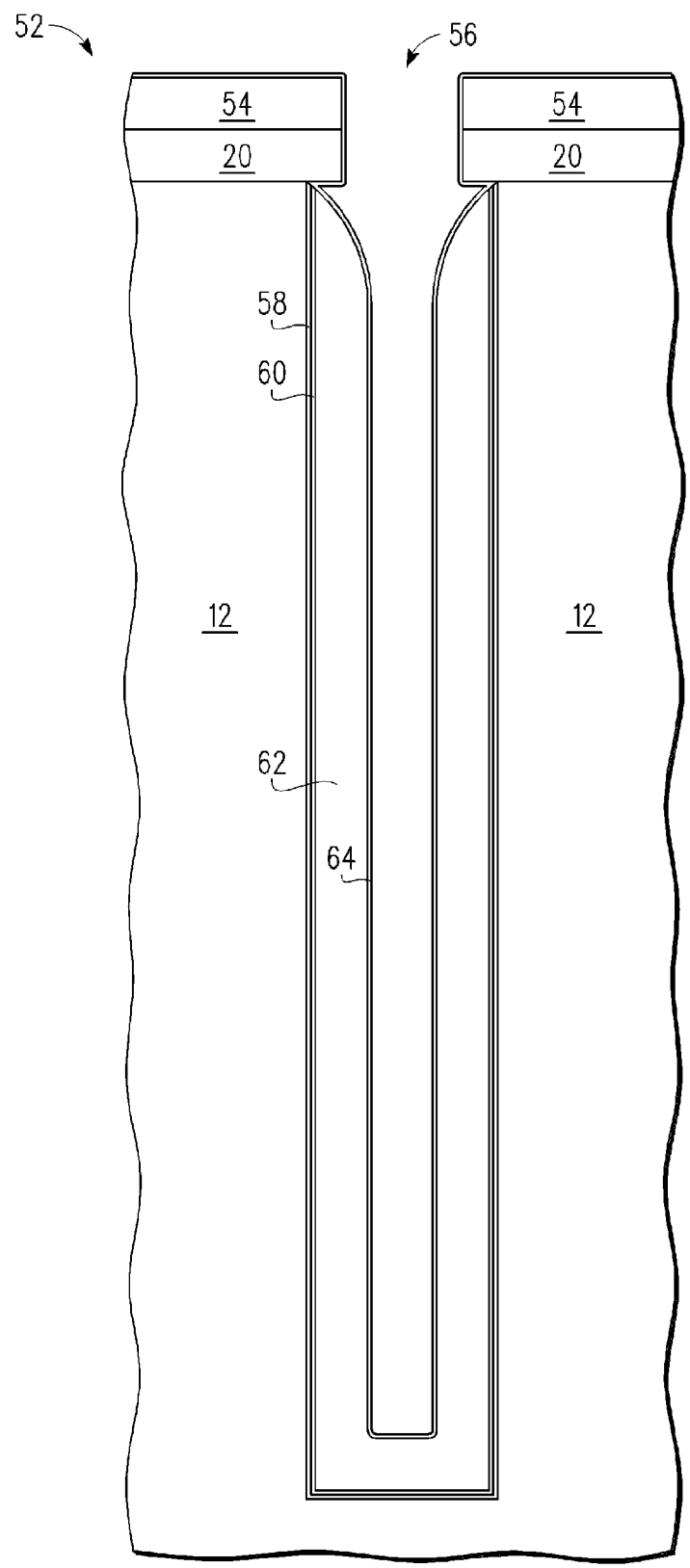
FIG. 16 is a cross section of the device structure of FIG. 15 at a subsequent stage in processing.

Shown in FIG. 16 is semiconductor device 52 after depositing a titanium nitride layer 64 the same as titanium nitride layer 46 as shown in FIG. 6. Titanium nitride layer 64 extends over hard mask 54 and interlayer dielectric 20. In this situation, the concern for flaking is small because to the extent that there is more than 1 micron it is going to be compressed in opening 58. Thus, titanium nitride layer 64 can be deposited by physical vapor deposition.

Figure 17:
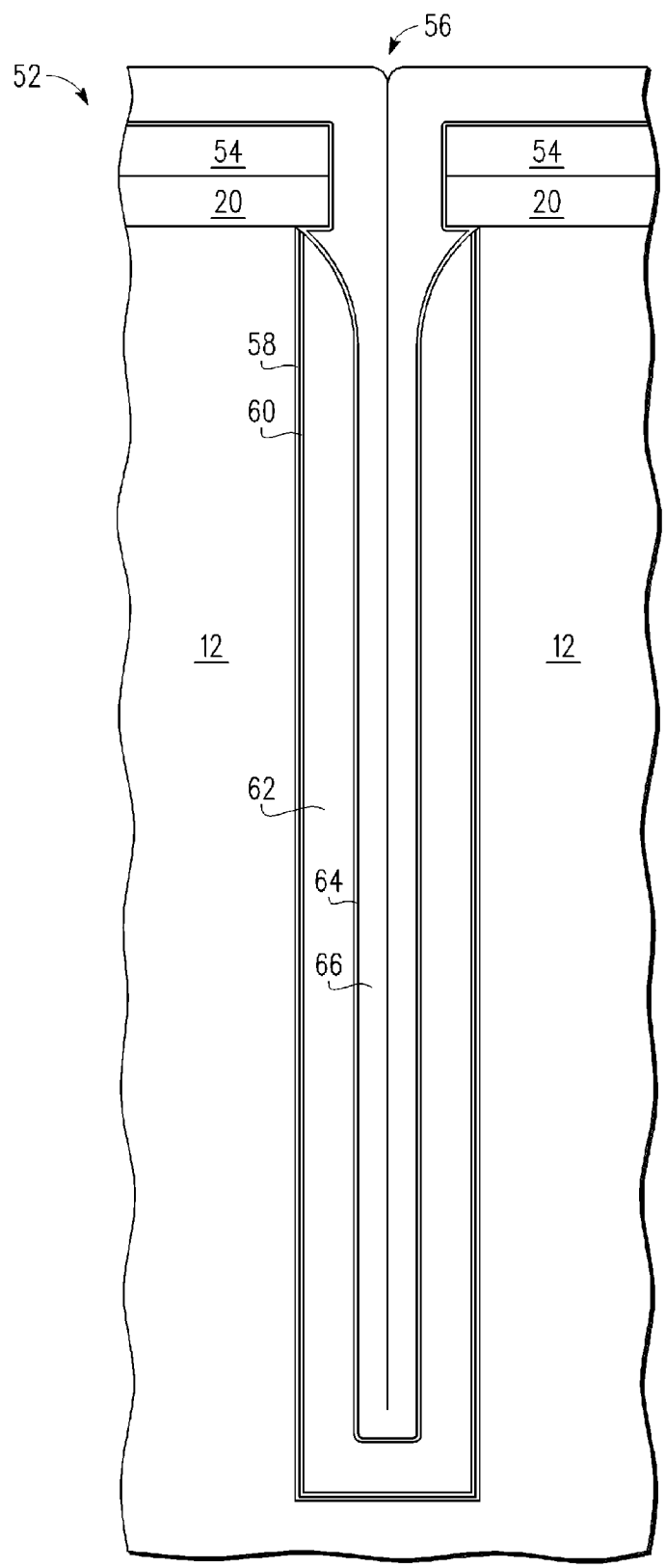
FIG. 17 is a cross section of the device structure of FIG. 16 at a subsequent stage in processing.

Shown in FIG. 17 is semiconductor device 52 after depositing a tungsten layer 66 that fills opening 58 as well being over titanium nitride layer 64 in the area over hard mask 54 and interlayer dielectric 20. Tungsten does not adhere well to oxide so the presence of titanium nitride layer 64 is significant in the successful deposition of tungsten layer 66. Tungsten layer 66 would flake and cause contamination issues if it did not adhere well. To fill opening 58, tungsten layer 66 is deposited to 1.0 micron in thickness. This is the maximum thickness to avoid flaking. Thus a 2 micron opening can be filled and be filled in just two depositions of tungsten. For a smaller through via, the initial tungsten deposition should be a little less than half of opening 58 size at the top of opening 58 so that it does not pinch off during the deposition. If opening 58 does close, it is a very long process to remove the tungsten at the top part of opening 58. Also the region under the overhand completely fills as well.

Figure 18:
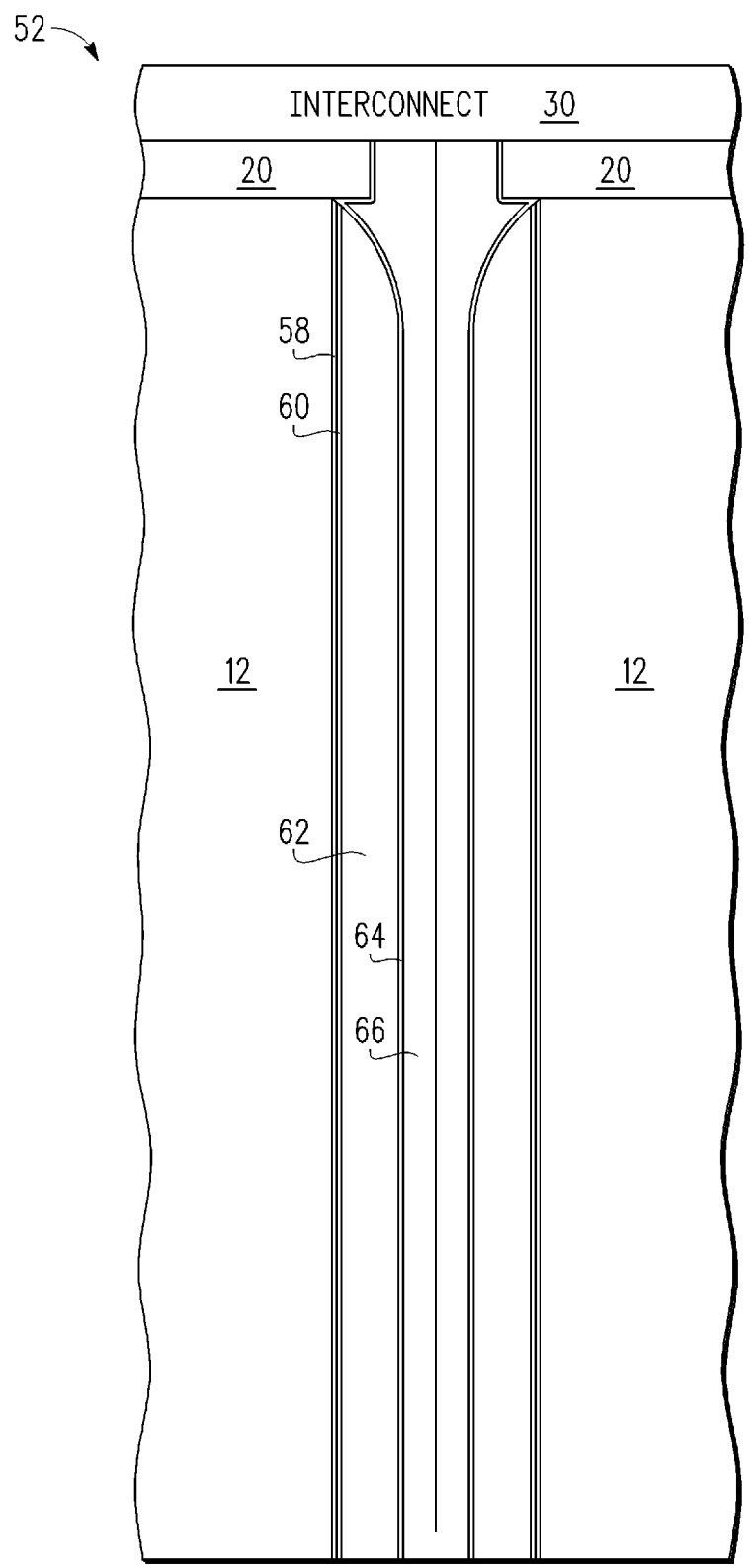
FIG. 18 is a cross section of the device structure of FIG. 17 at a subsequent stage in processing.

Shown in FIG. 18 is semiconductor device 52 after performing CMP down to interlayer dielectric 20, forming interconnect 30 over tungsten layers 62 and 66, and performing a backgrind on substrate 12 to expose tungsten layers 62, and 66, titanium nitride layers 64 and 60, and titanium layer 58. Between the steps of performing CMP and forming interconnect 30, contacts 24, 26, and 28 are formed.

The use of multiple alternating steps of titanium nitride and tungsten is useful in making a through via in both relatively narrow and relatively broad openings. The overhang at the top of the opening can present problems when there is a need for maximum metal deposition in providing the needed conductivity. An etch can be used to broaden the top portion of the opening so that the lower portion of the opening can be filled or least increased in metal content. Although a through via may be narrow, it can still be quite large by being long. Through vias are commonly for carrying large amounts of current so need to be relatively large but it also may need to be close to many different connecting points so it may be beneficial for it to be long but it can still be narrow. Thus, even though the through via may needs to have a large area, it may still be beneficially narrow and thus one or more aspects of the above described process may be utilized in achieving that shape including the narrow portion.

By now it should be appreciated that there has been provided a method for forming a through substrate via (TSV) in a semiconductor substrate having an interlevel dielectric layer overlying a top surface of the semiconductor substrate. The method includes forming a via opening within the interlevel dielectric layer and the semiconductor substrate, the via opening having a depth less than a thickness of the semiconductor substrate. The method further includes forming an adhesion layer within the via opening, wherein the adhesion layer comprises titanium (Ti). The method further includes forming a nucleation layer over the adhesion layer, wherein the nucleation layer comprises titanium nitride (TiN). The method further includes depositing a first tungsten (W) layer over the nucleation layer, the first tungsten layer having a thickness less than or equal to a critical film thickness sufficient to provide for film integrity and adhesion stability. The method further includes forming a stress relief layer over the first tungsten layer, wherein the stress relief layer comprises titanium nitride (TiN). The method further includes depositing a subsequent tungsten layer over the stress relief layer, the subsequent tungsten layer having a thickness less than or equal to the critical film thickness sufficient to provide for film integrity and adhesion stability, wherein a portion of the subsequent tungsten layer, the stress relief layer, the first tungsten layer, the nucleation layer, and the adhesion layer which overlie the interlevel dielectric collectively comprise an overlying composite layer. The method further includes planarizing to remove the overlying composite layer and to expose the interlevel dielectric layer and a top of the TSV. The method further includes backgrinding a bottom surface of the semiconductor substrate sufficient to expose a bottom of the TSV. The method may be further characterized by prior to planarizing, the method may further comprise depositing a subsequent stress relief layer overlying the subsequent tungsten layer, depositing of a still further tungsten layer overlying the subsequent stress relief layer, and repeating the depositing of the subsequent stress relief layer and the depositing of the still further tungsten layer a number of times sufficient to achieve a desired filling of the via opening. The method may be further characterized by the desired filling of the via opening including leaving a gap within the via opening and the method may further include filling the gap with a dielectric material. The method may be further characterized by the dielectric material comprising a spin on glass or a sub-atmosphere chemical vapor deposition (SACVD) dielectric material. The method may be further characterized by the via opening comprises a blind via having an aspect ratio of up to 50:1. The method may be further characterized by the via opening having a width dimension between 0.5 to 3.0 microns (5000 to 30000 angstroms) and a depth dimension of greater than 4.0 microns (40000 angstroms) but less than the thickness of the semiconductor substrate. The method may be further characterized by the forming the via opening including forming an insulative coating liner within the via opening. The method may be further characterized by the forming the via opening including forming a tapered via opening, wherein a bottom dimension of the tapered via opening is smaller than a top dimension of the tapered via opening. The method may be further characterized by the adhesion layer having a thickness on the order of 0.01 to 0.04 microns (100 to 400 angstroms), wherein the nucleation layer has a thickness on the order of 0.01 to 0.04 microns (100 to 400 angstroms), wherein the tungsten layer has a thickness on the order of up to 1.0 microns (10000 angstroms), wherein the stress relief layer has a thickness greater than a minimum thickness sufficient to overcome a surface roughness of the tungsten layer, and wherein the subsequent tungsten layer has a thickness on the order of up to 1.0 microns (10000 angstroms). The method may be further characterized by the forming the adhesion layer comprising using ion metal plasma (IMP) deposition, wherein forming the nucleation layer includes using chemical vapor deposition (CVD), wherein depositing the tungsten layer includes using chemical vapor deposition (CVD), wherein forming the stress relief layer includes using physical vapor deposition (PVD) or chemical vapor deposition (CVD), and wherein depositing the subsequent tungsten layer includes using chemical vapor deposition (CVD). The method may be further characterized by, for thicknesses greater than the critical film thickness, the tungsten layer would be prone to undesirable flaking characteristics. The method may be further characterized by depositing the tungsten layer and the subsequent tungsten layer including conformal depositing the tungsten layer and the subsequent tungsten layer. The method may be further characterized by the via opening having a width dimension at a top portion thereof which is subject to becoming constricted by the deposition of one or more of the first, subsequent, and further tungsten layers and which prevents the deposition of a yet further tungsten layer within the via opening sufficient to achieve a desired filling of the via opening, the method further comprising performing an etch back of a corresponding layer responsible for causing a constriction subsequent to the depositing of the one or more of the first, subsequent, and further tungsten layers, wherein the etch back enables deposition of still further layers within the via opening, depositing an additional layer within the via opening, wherein the additional layer comprises one or more of a further adhesion layer, a further nucleation layer, and a further stress relief layer, and depositing the yet further tungsten layer overlying the additional layer within the via opening. The method may be further characterized by, prior to the backgrinding, forming contact plug via openings within the interlevel dielectric layer and overlying an active device within the semiconductor substrate, filling the contact plug via openings with tungsten, and, after filling the contact plug via openings, planarizing a top surface of the contact plug via openings to form completed contact plugs. The method may be further characterized by, prior to the backgrinding, forming an interconnect layer overlying the completed contact plugs and the TSV. The method may be further characterized by forming an interconnect layer overlying the completed contact plugs and the TSV. The method may be further characterized by the TSV comprising one of a trench via, an annular via, and a sidewall via.

Also described is a method for forming a through substrate via (TSV) in a semiconductor substrate having an interlevel dielectric layer overlying a top surface of the semiconductor substrate. The method includes forming a via opening within the interlevel dielectric layer and the semiconductor substrate, the via opening having a depth less than a thickness of the semiconductor substrate. The method further includes forming an adhesion layer within the via opening, wherein the adhesion layer comprises titanium (Ti). The method further includes depositing a first tungsten (W) layer over the nucleation layer, the first tungsten layer having a thickness less than or equal to a critical film thickness sufficient to provide for film integrity and adhesion stability. The method further includes forming a stress relief layer over the first tungsten layer, wherein the stress relief layer comprises titanium nitride (TiN). The method further includes depositing a subsequent tungsten layer over the stress relief layer, the subsequent tungsten layer having a thickness less than or equal to the critical film thickness sufficient to provide for film integrity and adhesion stability, wherein a portion of the subsequent tungsten layer, the stress relief layer, the first tungsten layer, the nucleation layer, and the adhesion layer which overlie the interlevel dielectric layer collectively comprise an overlying composite layer. The method further includes planarizing to remove the overlying composite layer and to expose the interlevel dielectric layer and a top of the TSV. The method further includes forming contact plug via openings within the interlevel dielectric layer and overlying an active device within the semiconductor substrate. The method further includes filling the contact plug via openings with tungsten. The method further includes after filling the contact plug via openings, planarizing a top surface of the contact plug via openings to form completed contact plugs. The method further includes backgrinding a bottom surface of the semiconductor substrate sufficient to expose a bottom of the TSV, wherein the TSV comprises one of a trench via, an annular via, and a sidewall via. The method may further include, prior to planarizing, depositing a subsequent stress relief layer overlying the subsequent tungsten layer, depositing of a still further tungsten layer overlying the subsequent stress relief layer, and repeating the depositing of the subsequent stress relief layer and the depositing of the still further tungsten layer a number of times sufficient to achieve a desired filling of the via opening, wherein the desired filling of the via opening includes leaving a gap within the via opening and filling the gap with a dielectric material, wherein the dielectric material comprises a spin on glass or a sub-atmosphere chemical vapor deposition (SACVD) dielectric material. The method may be further characterized by the via opening having a width dimension at a top portion thereof which is subject to becoming constricted by the deposition of one or more of the first, subsequent, and further tungsten layers and which prevents deposition of a yet further tungsten layer within the via opening sufficient to achieve a desired filling of the via opening and may further include performing an etch back of a corresponding layer responsible for causing a constriction subsequent to the deposition of the one or more of the first, subsequent, and further tungsten layers, wherein the etch back enables deposition of still further layers within the via opening, depositing an additional layer within the via opening, wherein the additional layer comprises one or more of a further adhesion layer, a further nucleation layer, and a further stress relief layer, and depositing the yet further tungsten layer overlying the additional layer within the via opening.

Described also is a semiconductor device structure including a through substrate via (TSV) in a semiconductor substrate having an interlevel dielectric layer overlying a top surface of the substrate. The method includes forming a via opening within the interlevel dielectric layer and the substrate, the via opening having a depth less than a thickness of the substrate. The method further includes forming an adhesion layer within the via opening, wherein the adhesion layer comprises titanium (Ti). The method further includes forming a nucleation layer over the adhesion layer, wherein the nucleation layer comprises titanium nitride (TiN). The method further includes depositing a first tungsten (W) layer over the nucleation layer, the first tungsten layer having a thickness less than or equal to a critical film thickness sufficient to provide for film integrity and adhesion stability. The method further includes forming a stress relief layer over the first tungsten layer, wherein the stress relief layer comprises titanium nitride (TiN). The method further includes depositing a subsequent tungsten layer over the stress relief layer, the subsequent tungsten layer having a thickness less than or equal to the critical film thickness sufficient to provide for film integrity and adhesion stability, wherein a portion of the subsequent tungsten layer, the stress relief layer, the first tungsten layer, the nucleation layer, and the adhesion layer which overlie the interlevel dielectric layer collectively comprise an overlying composite layer. The method further includes planarizing to remove the overlying composite layer and to expose the interlevel dielectric layer and a top of the TSV. The method further includes backgrinding a bottom surface of the substrate sufficient to expose a bottom of the TSV.

Although the invention is described herein with reference to specific embodiments, various modifications and changes can be made without departing from the scope of the present invention as set forth in the claims below. For example, an anisotropic etch followed by an isotropic etch has been found to be beneficial for widening a top portion of the opening after a tungsten deposition, another etch or combination of etches may also be effective. Also titanium was described as being directly applied to the substrate in the opening, an oxide layer may be grown or otherwise formed as the interface between the substrate and the through via. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A method for forming a through substrate via (TSV) in a semiconductor substrate having an interlevel dielectric layer overlying a top surface of the semiconductor substrate, the method comprising:
    forming a via opening within the interlevel dielectric layer and the semiconductor substrate, the via opening having a depth less than a thickness of the semiconductor substrate;
    forming an adhesion layer within the via opening, wherein the adhesion layer comprises titanium (Ti);
    forming a nucleation layer over the adhesion layer, wherein the nucleation layer comprises titanium nitride (TiN);
    depositing a first tungsten (W) layer over the nucleation layer, the first tungsten layer having a thickness less than or equal to a critical film thickness sufficient to provide for film integrity and adhesion stability;
    forming a stress relief layer over the first tungsten layer, wherein the stress relief layer comprises titanium nitride (TiN);
    depositing a subsequent tungsten layer over the stress relief layer, the subsequent tungsten layer having a thickness less than or equal to the critical film thickness sufficient to provide for film integrity and adhesion stability, wherein a portion of the subsequent tungsten layer, the stress relief layer, the first tungsten layer, the nucleation layer, and the adhesion layer which overlie the interlevel dielectric collectively comprise an overlying composite layer;
    planarizing to remove the overlying composite layer and to expose the interlevel dielectric layer and a top of the TSV; and
    backgrinding a bottom surface of the semiconductor substrate sufficient to expose a bottom of the TSV.

2. The method of claim 1, wherein prior to planarizing, the method further comprising:
    depositing a subsequent stress relief layer overlying the subsequent tungsten layer;
    depositing of a still further tungsten layer overlying the subsequent stress relief layer; and
    repeating the depositing of the subsequent stress relief layer and the depositing of the still further tungsten layer a number of times sufficient to achieve a desired filling of the via opening.

3. The method of claim 2, wherein the desired filling of the via opening includes leaving a gap within the via opening, the method further comprising:
    filling the gap with a dielectric material.

4. The method of claim 3, wherein the dielectric material comprises a spin on glass or a sub-atmosphere chemical vapor deposition (SACVD) dielectric material.

5. The method of claim 1, wherein the via opening comprises a blind via having an aspect ratio of up to 50:1.

6. The method of claim 1, wherein the via opening has a width dimension between 0.5 to 3.0 microns (5000 to 30000 angstroms) and a depth dimension of greater than 4.0 microns (40000 angstroms) but less than the thickness of the semiconductor substrate.

7. The method of claim 1, wherein forming the via opening includes forming an insulative coating liner within the via opening.

8. The method of claim 1, wherein forming the via opening includes forming a tapered via opening, wherein a bottom dimension of the tapered via opening is smaller than a top dimension of the tapered via opening.

9. The method of claim 1, wherein the adhesion layer has a thickness on the order of 0.01 to 0.04 microns (100 to 400 angstroms), wherein the nucleation layer has a thickness on the order of 0.01 to 0.04 microns (100 to 400 angstroms), wherein the tungsten layer has a thickness on the order of up to 1.0 microns (10000 angstroms), wherein the stress relief layer has a thickness greater than a minimum thickness sufficient to overcome a surface roughness of the tungsten layer, and wherein the subsequent tungsten layer has a thickness on the order of up to 1.0 microns (10000 angstroms).

10. The method of claim 1, wherein forming the adhesion layer comprises using ion metal plasma (IMP) deposition, wherein forming the nucleation layer comprises using chemical vapor deposition (CVD), wherein depositing the tungsten layer includes using chemical vapor deposition (CVD), wherein forming the stress relief layer comprises using physical vapor deposition (PVD) or chemical vapor deposition (CVD), and wherein depositing the subsequent tungsten layer includes using chemical vapor deposition (CVD).

11. The method of claim 1, wherein for thicknesses greater than the critical film thickness, the tungsten layer would be prone to undesirable flaking characteristics.

12. The method of claim 1, wherein depositing the tungsten layer and the subsequent tungsten layer comprise conformal depositing the tungsten layer and the subsequent tungsten layer.

13. The method of claim 1, wherein the via opening has a width dimension at a top portion thereof which is subject to becoming constricted by the deposition of one or more of the first, subsequent, and further tungsten layers and which prevents the deposition of a yet further tungsten layer within the via opening sufficient to achieve a desired filling of the via opening, the method further comprising:
    performing an etch back of a corresponding layer responsible for causing a constriction subsequent to the depositing of the one or more of the first, subsequent, and further tungsten layers, wherein the etch back enables deposition of still further layers within the via opening;
    depositing an additional layer within the via opening, wherein the additional layer comprises one or more of a further adhesion layer, a further nucleation layer, and a further stress relief layer; and
    depositing the yet further tungsten layer overlying the additional layer within the via opening.

14. The method of claim 1, wherein prior to the backgrinding, the method further comprising:
    forming contact plug via openings within the interlevel dielectric layer and overlying an active device within the semiconductor substrate;
    filling the contact plug via openings with tungsten; and
    after filling the contact plug via openings, planarizing a top surface of the contact plug via openings to form completed contact plugs.

15. The method of claim 14, wherein prior to the backgrinding, the method further comprising:
    forming an interconnect layer overlying the completed contact plugs and the TSV.

16. The method of claim 1, wherein the TSV comprises one of a trench via, an annular via, and a sidewall via.

17. A method for forming a through substrate via (TSV) in a semiconductor substrate having an interlevel dielectric layer overlying a top surface of the semiconductor substrate, the method comprising:
    forming a via opening within the interlevel dielectric layer and the semiconductor substrate, the via opening having a depth less than a thickness of the semiconductor substrate;
    forming an adhesion layer within the via opening, wherein the adhesion layer comprises titanium (Ti);
    forming a nucleation layer over the adhesion layer, wherein the nucleation layer comprises titanium nitride (TiN);
    depositing a first tungsten (W) layer over the nucleation layer, the first tungsten layer having a thickness less than or equal to a critical film thickness sufficient to provide for film integrity and adhesion stability;
    forming a stress relief layer over the first tungsten layer, wherein the stress relief layer comprises titanium nitride (TiN);
    depositing a subsequent tungsten layer over the stress relief layer, the subsequent tungsten layer having a thickness less than or equal to the critical film thickness sufficient to provide for film integrity and adhesion stability, wherein a portion of the subsequent tungsten layer, the stress relief layer, the first tungsten layer, the nucleation layer, and the adhesion layer which overlie the interlevel dielectric layer collectively comprise an overlying composite layer;
    planarizing to remove the overlying composite layer and to expose the interlevel dielectric layer and a top of the TSV;
    forming contact plug via openings within the interlevel dielectric layer and overlying an active device within the semiconductor substrate;
    filling the contact plug via openings with tungsten;
    after filling the contact plug via openings, planarizing a top surface of the contact plug via openings to form completed contact plugs; and
    backgrinding a bottom surface of the semiconductor substrate sufficient to expose a bottom of the TSV, wherein the TSV comprises one of a trench via, an annular via, and a sidewall via.

18. The method of claim 17, wherein prior to planarizing, the method further comprising:
    depositing a subsequent stress relief layer overlying the subsequent tungsten layer;
    depositing of a still further tungsten layer overlying the subsequent stress relief layer; and
    repeating the depositing of the subsequent stress relief layer and the depositing of the still further tungsten layer a number of times sufficient to achieve a desired filling of the via opening, wherein the desired filling of the via opening includes leaving a gap within the via opening and filling the gap with a dielectric material, wherein the dielectric material comprises a spin on glass or a sub-atmosphere chemical vapor deposition (SACVD) dielectric material.

19. The method of claim 17, wherein the via opening has a width dimension at a top portion thereof which is subject to becoming constricted by the deposition of one or more of the first, subsequent, and further tungsten layers and which prevents deposition of a yet further tungsten layer within the via opening sufficient to achieve a desired filling of the via opening, the method further comprising:
    performing an etch back of a corresponding layer responsible for causing a constriction subsequent to the deposition of the one or more of the first, subsequent, and further tungsten layers, wherein the etch back enables deposition of still further layers within the via opening;
    depositing an additional layer within the via opening, wherein the additional layer comprises one or more of a further adhesion layer, a further nucleation layer, and a further stress relief layer; and
    depositing the yet further tungsten layer overlying the additional layer within the via opening.

\* \* \* \* \*